(12) United States Patent
Sim et al.

(10) Patent No.: US 9,224,966 B2
(45) Date of Patent: Dec. 29, 2015

(54) ORGANIC LIGHT-EMITTING DEVICE, METHOD OF MANUFACTURING THE SAME, AND FLAT PANEL DISPLAY DEVICE INCLUDING THE SAME

(75) Inventors: Joong-Won Sim, Yongin (KR); Kwan-Hee Lee, Yongin (KR); Ji-Hwan Yoon, Yongin (KR); Ja-Hyun Im, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 682 days.

(21) Appl. No.: 13/543,752

(22) Filed: Jul. 6, 2012

(65) Prior Publication Data
US 2013/0112949 A1    May 9, 2013

(30) Foreign Application Priority Data
Nov. 8, 2011    (KR) .................... 10-2011-0115925

(51) Int. Cl.
*H01L 51/50* (2006.01)
*H01L 51/00* (2006.01)

(52) U.S. Cl.
CPC ........ *H01L 51/5016* (2013.01); *H01L 51/5008* (2013.01); *H01L 51/508* (2013.01); *H01L 51/0077* (2013.01); *H01L 51/0085* (2013.01); *H01L 51/0092* (2013.01); *H01L 2251/5346* (2013.01); *H01L 2251/558* (2013.01)

(58) Field of Classification Search
None
See application file for complete search history.

(56) References Cited

U.S. PATENT DOCUMENTS

| | | | |
|---|---|---|---|
| 2006/0124924 A1* | 6/2006 | Suh et al. | ........... 257/40 |
| 2009/0232976 A1 | 9/2009 | Yoon et al. | |
| 2011/0084259 A1* | 4/2011 | Lee et al. | ........... 257/40 |
| 2011/0215308 A1 | 9/2011 | Im et al. | |

FOREIGN PATENT DOCUMENTS

| | | |
|---|---|---|
| KR | 10-2010-0022638 A | 3/2010 |
| KR | 10-2010-0080763 | 7/2010 |
| KR | 10-2011-0040735 | 4/2011 |
| KR | 10-2011-0101418 | 9/2011 |

* cited by examiner

*Primary Examiner* — Gregory Clark
(74) *Attorney, Agent, or Firm* — Christie, Parker & Hale, LLP

(57) ABSTRACT

An organic light-emitting device including: a substrate; a first electrode; a second electrode; an emission layer between the first electrode and the second electrode; and an electron transport layer between the emission layer and the second electrode, wherein the emission layer includes a blue emission layer, the electron transport layer includes a unit that includes a first single layer including a first material, a first mixed layer on the first single layer and including the first material and a second material, a second single layer on the first mixed layer and including the second material, a second mixed layer on the second single layer and including the first and second materials, and a third single layer on the second mixed layer and including the first material, wherein the first mixed layer has a thickness that is larger than that of the second mixed layer.

18 Claims, 5 Drawing Sheets

ORGANIC LIGHT-EMITTING DEVICE, METHOD OF MANUFACTURING THE SAME, AND FLAT PANEL DISPLAY DEVICE INCLUDING THE SAME

CROSS-REFERENCE TO RELATED PATENT APPLICATION

This application claims priority to and the benefit of Korean Patent Application No. 10-2011-0115925, filed on Nov. 8, 2011, in the Korean Intellectual Property Office, the disclosure of which is incorporated herein in its entirety by reference.

BACKGROUND

1. Field

The following description relates to an organic light-emitting device including an electron transport layer having a multi-layer structure, a method of manufacturing the organic light-emitting device, and a flat panel display device including the organic light-emitting device.

2. Description of Related Art

Organic light-emitting devices (OLEDs), which are self-emitting devices, have advantages such as wide viewing angles, excellent contrast, quick response, high brightness, excellent driving voltage characteristics, and can provide multicolored images. Due to these characteristics OLEDs have been receiving growing attention.

A typical OLED has a structure including a substrate, and an anode, a hole transport layer (HTL), an emission layer (EML), an electron transport layer (ETL), and a cathode which are sequentially stacked on the substrate. The HTL, the EML, and the ETL are normally organic thin films formed of organic compounds. When a voltage is applied between the anode and the cathode, holes injected from the anode move to the EML via the HTL, and electrons injected from the cathode move to the EML via the ETL. The holes and electrons recombine in the EML to generate excitons. When the excitons drop from an excited state to a ground state, light is emitted.

SUMMARY

Aspects of embodiments of the present invention are directed toward an organic light-emitting device of which a blue light-emitting diode has a remarkably increased lifespan by use of a multi-layered electron transport layer, a method of manufacturing the organic light-emitting device, and a flat panel display device including the organic light-emitting device.

An aspect of an embodiment of the present invention is directed toward an organic light-emitting device that includes a multi-layered electron transport layer to achieve balanced injection and flow between holes and electrons, and thus has improved performance in terms of efficiency and lifetime.

An aspect of an embodiment of the present invention is directed toward a method of manufacturing the organic light-emitting device, and a flat panel display device including the organic light-emitting device.

According to an embodiment of the present invention, there is provided an organic light-emitting device including: a substrate; a first electrode; a second electrode; an emission layer between the first electrode and the second electrode; and an electron transport layer between the emission layer and the second electrode, wherein the emission layer includes a blue emission layer, and the electron transport layer includes a unit that includes a first single layer including a first material, a first mixed layer on the first single layer and including the first material and a second material, a second single layer on the first mixed layer and including the second material, a second mixed layer on the second single layer and including the first and second materials, and a third single layer on the second mixed layer and including the first material, and the first mixed layer has a thickness that is larger than that of the second mixed layer.

The electron transport layer may include a plurality of units including the unit, each of the plurality of units being identical with one another.

A thickness ratio of the first mixed layer to the second mixed layer may be from about 2:1 to about 5:1.

The first mixed layer may have a thickness that is larger than that of the third mixed layer.

A thickness ratio of the first single layer to the third single layer may be from about 2:1 to about 5:1.

The first single layer, the second single layer, and the third single layer may each independently have a thickness of from about 1 Å to about 100 Å.

The first mixed layer and the second mixed layer may each independently have a thickness of from about 10 Å to about 300 Å.

One of the first single layer, the second single layer, and the third single layer may have a thickness that is smaller than that of one of the first mixed layer and the second mixed layer.

The second material in at least one of the first mixed layer and the second mixed layer may have a concentration gradient.

The first material may include an anthracene-based material.

The second material may include a lithium (Li) complex.

The organic light-emitting device may further include at least one of a hole injection layer and a hole transport layer between the first electrode and the emission layer.

The organic light-emitting device may further include an electron injection layer between the electron transport layer and the second electrode.

The electron transport layer may further include: a fourth single layer disposed on the third single layer and including the first material; a third mixed layer disposed on the fourth single layer and including the first and second materials; a fifth single layer disposed on the third mixed layer material and including the second material; a fourth mixed layer disposed on the fifth single layer and including the first and second materials; and a sixth single layer disposed on the fourth mixed layer and including the first material, wherein the third mixed layer has a thickness that is larger than that of the fourth mixed layer, and the fourth single layer has a thickness that is larger than that of the sixth single layer.

According to another embodiment of the present invention, there is provided a method of manufacturing an organic light-emitting device, the method including: forming a first electrode on a substrate; forming an emission layer on the first electrode; forming an electron transport layer on the emission layer; and forming a second electrode on the electron transport layer, wherein the forming of the electron transport layer includes: preparing a first deposition source for discharging a first material, and a second deposition source for discharging a second material; disposing the first deposition source and the second deposition source to be so separated from each other that a first material discharging region and a second material discharging region at least partially overlap with each other; and reciprocating the first deposition source and the second deposition source at least once between first and second ends (terminals) of a region for forming the electron transport layer to form at least one unit that comprises a first single layer including a first material, a first mixed layer disposed on the first single layer and including the first material and a second material, a second single layer disposed on the first mixed layer and including the second material, a second mixed layer disposed on the second single layer and including the first and second materials, and a third single layer disposed on the second mixed layer and including the first material.

The reciprocating of the first deposition source and the second deposition source may be performed twice.

According to another embodiment of the present invention, there is provided a flat panel display device including: a transistor including a source, a drain, a gate, and an active layer; and the above-described organic light-emitting device, wherein one of the source and drain of the transistor is electrically connected to the first electrode of the organic light-emitting device.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

As used herein, the term "and/or" includes any and all combinations of one or more of the associated listed items. Expressions such as "at least one of," when preceding a list of elements, modify the entire list of elements and do not modify the individual elements of the list.

Figure 1:
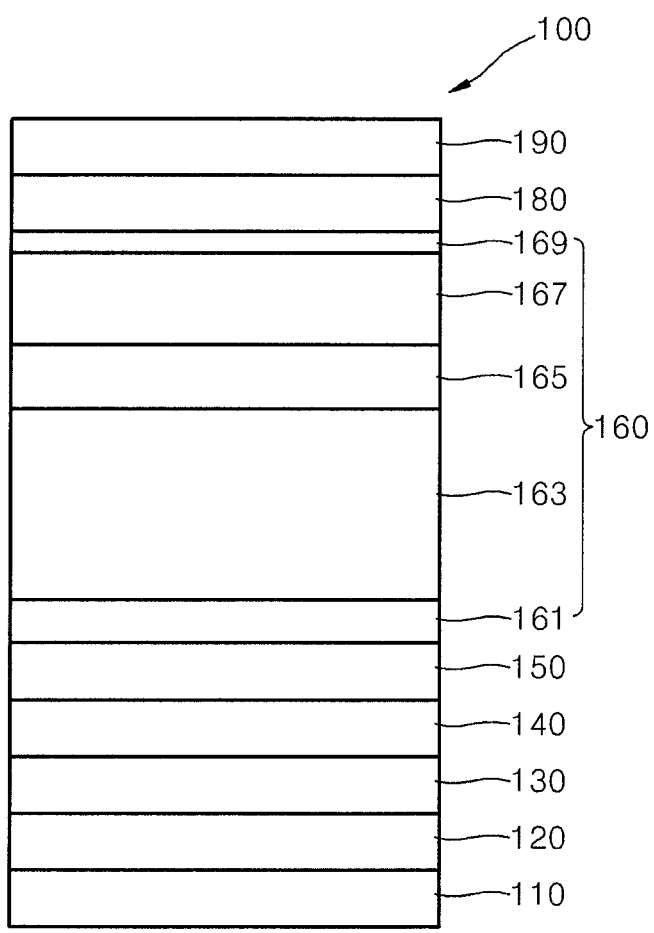
FIG. 1 is a schematic diagram of the structure of an organic light-emitting device according to an embodiment of the present invention.

FIG. 1 is a cross-sectional view of the structure of an organic light-emitting device 100 according to an embodiment of the present invention.

Referring to FIG. 1, the organic light emitting device 100 has a structure including a substrate 110, a first electrode 120, a hole injection layer (HIL) 130, a hole transport layer (HTL) 140, an emission layer (EML) 150, an electron transport layer (ETL) 160, an electron injection layer (EIL) 180, and a second electrode 190 that are sequentially stacked on one another. The EML 150 includes a blue emission layer. The ETL 160 includes: a first single layer 161 containing a first material (containing only the first material); a first mixed layer 163 disposed on the first single layer 161 and containing the first material and a second material; a second single layer 165 disposed on the first mixed layer 163 and containing the second material (containing only the second material); a second mixed layer 167 disposed on the second single layer 165 and containing the first and second materials; and a third single layer 169 disposed on the second mixed layer 167 and containing the first material (containing only the first material). The first mixed layer 163 may have a thickness that is larger than that of the second mixed layer 167.

The substrate 110 may be any substrate that is used in existing organic light-emitting devices. In some embodiments, the substrate 11 may be a glass substrate or a transparent plastic substrate with strong mechanical strength, thermal stability, transparency, surface smoothness, ease of handling, and water resistance, but is not limited thereto.

The first electrode 120 is disposed on the substrate 110. The first electrode 120 may be formed by depositing or sputtering a first electrode-forming material on the substrate 110. The first electrode 120 may constitute an anode, wherein a material having a high-work function may be used as the first electrode-forming material to facilitate hole injection. The first electrode 120 may be a transmission electrode or a semi-transmission electrode. The transmission electrode may be formed using a transparent material having high conductivity, for example, ITO, IZO, $SnO_2$, or ZnO. The semi-transmission electrode may be formed using, for example, magnesium (Mg), aluminum (Al), aluminum-lithium (Al—Li), calcium (Ca), magnesium-indium (Mg—In), or magnesium-silver (Mg—Ag).

The HIL 130 is disposed on the first electrode 120. The HIL 130 may be formed on the first electrode 120 by any of a variety of methods, such as vacuum deposition, spin coating, casting, or Langmuir-Blodgett (LB) deposition.

When the HIL 130 is formed using vacuum deposition, the deposition conditions may vary according to a compound that is used to form the HIL 130, and the structure and thermal properties of the HIL 130 to be formed. In general, however, conditions for vacuum deposition may include a deposition temperature of 100 to 500° C., a pressure of $10^{-8}$ to $10^{-3}$ torr, and a deposition rate of 0.01 to 100 Å/sec.

When the HIL 130 is formed using spin coating, coating conditions may vary according to the material used to form the HIL 130, and the structure and thermal properties of the HIL 130. For example, the coating conditions may include a coating speed of about 2000 rpm to about 5000 rpm, and a thermal treatment temperature of about 80° C. to about 200° C. at which the solvent remaining after coating may be removed.

A HIL material may be any known hole injection material and may be, for example, a phthalocyanine compound such as copper phthalocyanine, 4,4',4"-tris(3-methylphenylphenylamino)triphenylamine (m-MTDATA), TDATA, 2T-NATA, polyaniline/dodecylbenzenesulfonic acid (Pani/DBSA), poly (3,4-ethylenedioxythiophene)/poly(4-styrenesulfonate) (PEDOT/PSS), polyaniline/camphor sulfonicacid (Pani/CSA), or polyaniline/poly(4-styrenesulfonate) (PANI/PSS), but is not limited thereto.

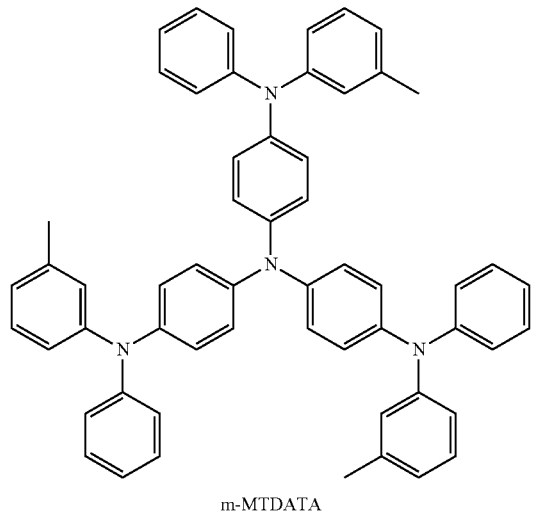

m-MTDATA

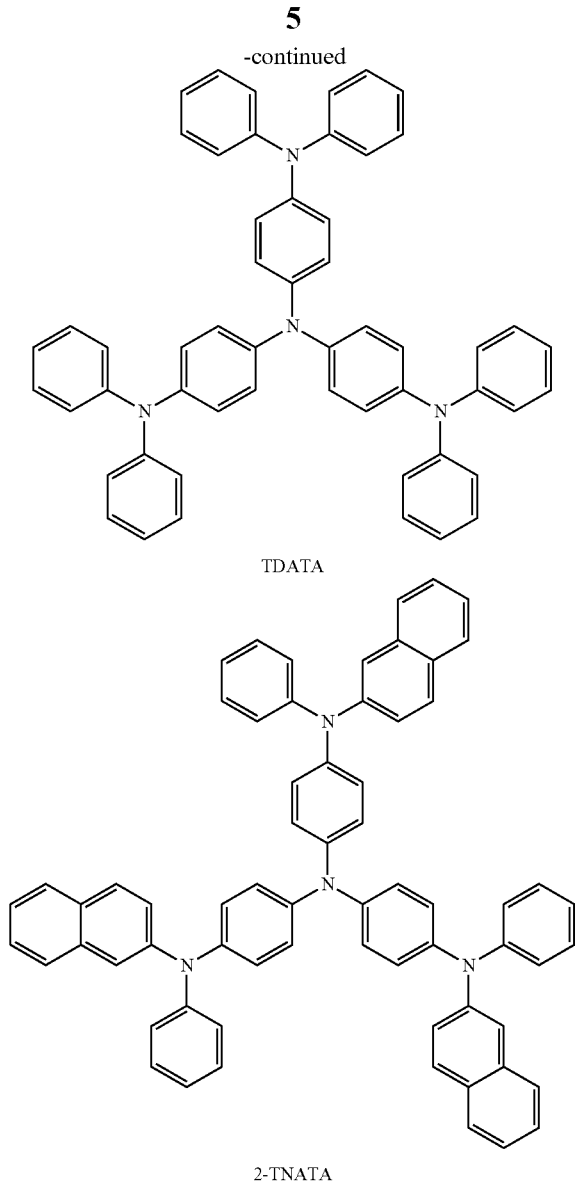

TDATA

2-TNATA

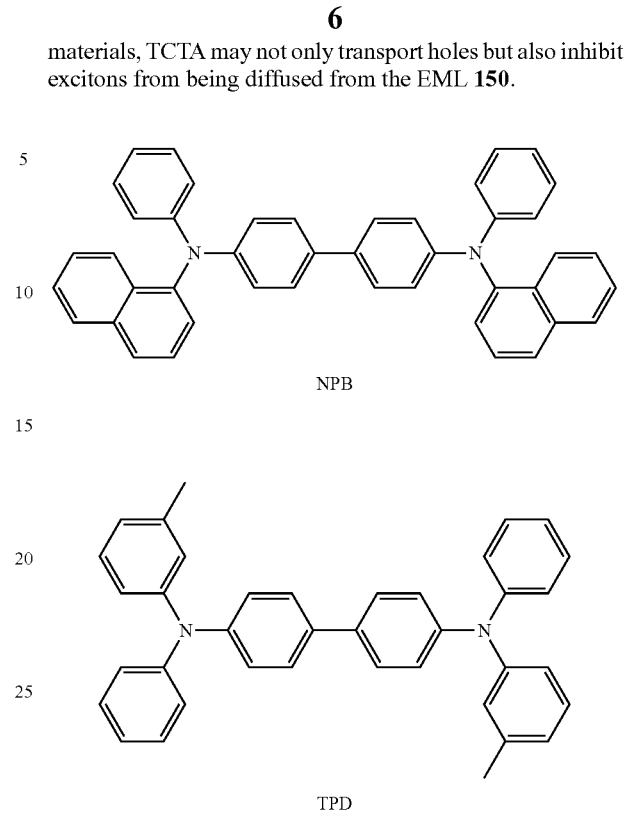

NPB

TPD

The HIL 130 may have a thickness of about 100 Å to about 10000 Å, and in some embodiments, may have a thickness of about 100 Å to about 1000 Å. When the thickness of the HIL 130 is within these ranges, the HIL 130 may have satisfactory hole injecting ability without a substantial increase in driving voltage.

The HTL 140 may be disposed on the HIL 130. The HTL 140 may be formed by any of a variety of methods, such as vacuum deposition, spin coating, casting, or LB deposition. When the HTL 140 is formed using vacuum deposition or spin coating, the conditions for deposition and coating may be similar to those for the formation of the HIL 130, although the conditions for the deposition and coating may vary according to the material that is used to form the HTL 140.

A HTL material may be any known hole transport material, and may be, for example, a carbazole derivative such as N-phenylcarbazole or polyvinylcarbazole; an amine derivative having an aromatic condensed ring, such as N,N'-bis(3-methylphenyl)-N,N'-diphenyl-[1,1-biphenyl]-4,4'-diamine (TPD) or N,N'-di(naphthalene-1-yl)-N,N'-diphenyl benzidine (NPB); or a triphenylamine-based material, such as 4,4',4"-tris(N-carbazolyl)triphenylamine (TCTA). Among these materials, TCTA may not only transport holes but also inhibit excitons from being diffused from the EML 150.

The HTL 140 may have a thickness of about 50 Å to about 1000 Å, and in some embodiments, may have a thickness of about 100 Å to about 800 Å. When the thickness of the HTL 140 is within these ranges, the HTL 140 may have satisfactory hole transporting ability without a substantial increase in driving voltage.

The EML 150 may be disposed on the HTL 140. The EML 150 may include a blue emission layer. In green and red emission layers in which electron mobility is higher than hole mobility, preventing migration of electrons to the HTL 140 is crucial. Also, in a blue emission layer in which hole mobility is higher than electron mobility, preventing migration of holes to the ETL 160 is crucial. If the holes in the blue emission layer are concentrated near the ETL 160 due to this reason, emission lifetime may be reduced. To prevent this drawback, the ETL 160 may be formed as follows.

The EML 150 may be formed on the HTL 140 by using vacuum deposition, spin coating, casting, or LB deposition. When the EML 150 is formed using vacuum deposition or spin coating, the conditions for deposition and coating may be similar to those for the formation of the HIL 130, although the conditions for deposition and coating may vary according to the material that is used to form the EML 150.

The EML 150 may include a compound or a combination of a host and a dopant. Examples of the host are, but are not limited to, Alq3, 4,4'-N,N'-dicarbazole-biphenyl(CBP), 9,10-di(naphthalene-2-yl)anthracene (ADN), TCTA, 1,3,5-tris(N-phenylbenzimidazole-2-yl)benzene (TPBI), 3-tert-butyl-9,10-di-2-naphthylanthracene (TBADN), E3, distyrylarylene (DSA), ADN, Bis(2-(2-hydroxyphenyl)benzothiazolate)zinc $(Zn(BTZ)_2)$, Compound 1 below, and Compound 2 below.

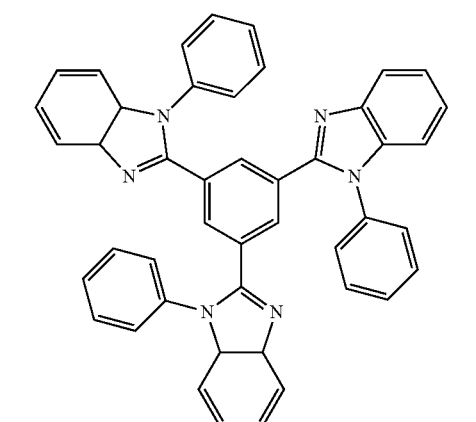
TPBI
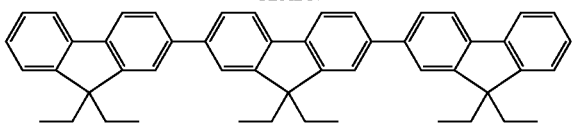
TBADN
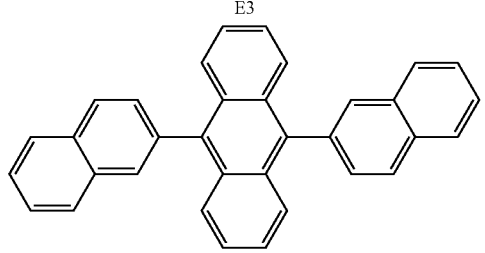
E3
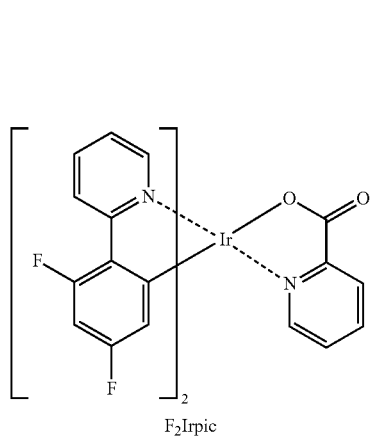
ADN
Compound 1
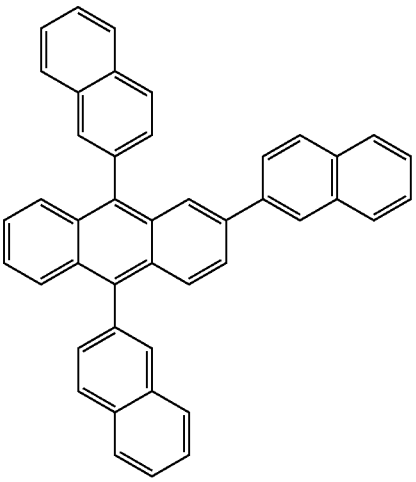
Compound 2
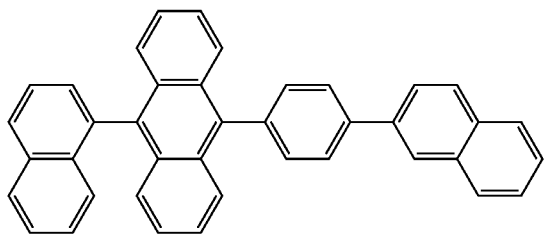
Examples of blue dopants are F$_2$Irpic, (F$_2$ppy)$_2$Ir(tmd), Ir(dfppz)$_3$, ter-fluorene, 4.4'-bis(4-diphenyl amiostyryl)biphenyl (DPAVBi), 2,5,8,11-tetra-tert-butyl perylene (TBPe), and Compound 4 below, but are not limited thereto.
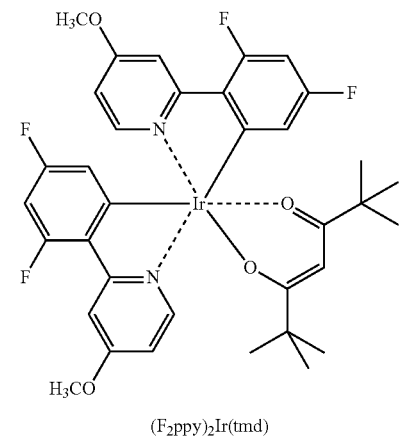 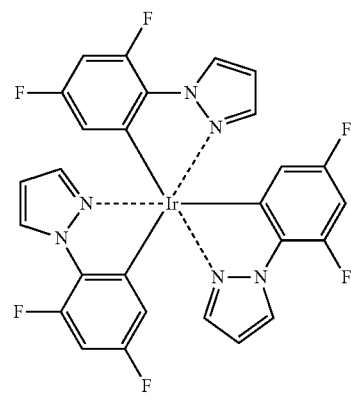
F$_2$Irpic     (F$_2$ppy)$_2$Ir(tmd)     Ir(dfppz)$_3$

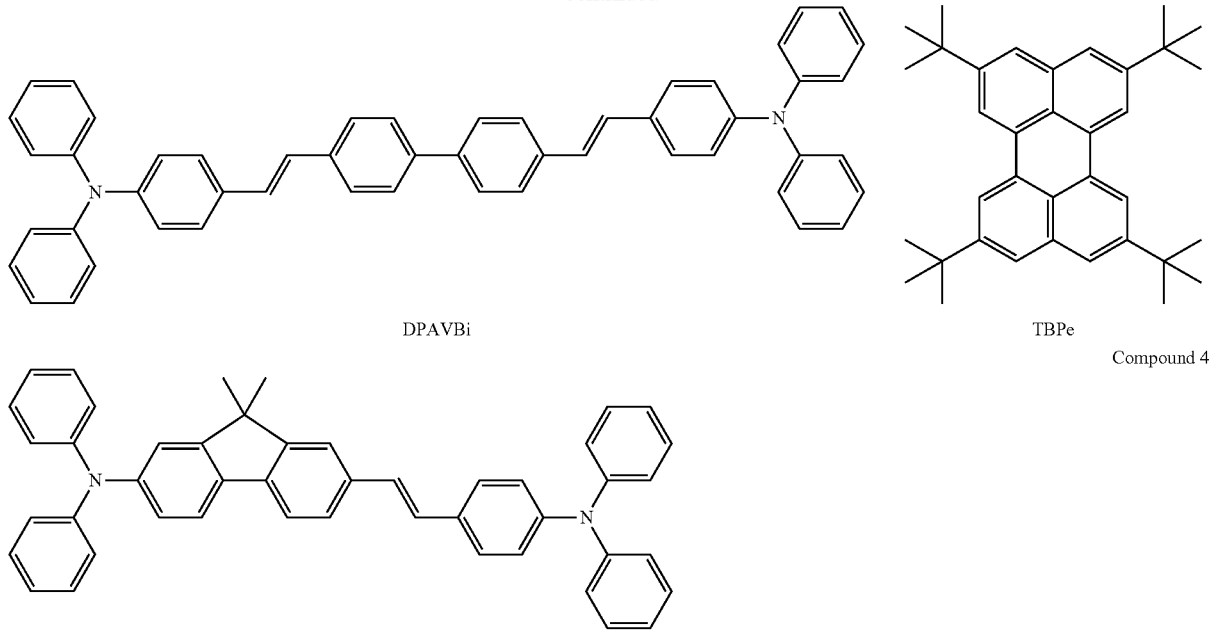

DPAVBi

TBPe

Compound 4

When a dopant and a host are used together, the amount of the dopant may be from about 0.01 to about 15 parts by weight based on 100 parts by weight of the host, but is not limited thereto.

The EML 150 may have a thickness of from about 100 Å to about 1000 Å, and in some embodiments, may have a thickness of from about 200 Å to about 600 Å. When the thickness of the EML 150 is within these ranges, the EML 150 may have improved light emitting properties without a substantial decrease in driving voltage.

A hole blocking layer (HBL) (not shown in FIG. 1) may be disposed on the EML 150. When a phosphorescent dopant is also used in the EML 150, the HBL may be formed on the EML 150 by using vacuum deposition, spin coating, casting, Langmuir-Blodgett (LB) deposition, or the like, in order to prevent diffusion of triplet excitons or holes into the ETL 160. When the HBL is formed using vacuum deposition or spin coating, the conditions for deposition and coating may be similar to those for the formation of the HIL, although the conditions for deposition and coating may vary according to the material that is used to form the HBL. Any suitable hole-blocking material may be used. Non-limiting examples of hole-blocking materials are an oxadiazole derivative, a triazole derivative, and a phenanthroline derivative.

The HBL may have a thickness of from about 50 Å to about 1000 Å, and in some embodiments, may have a thickness of from about 100 Å to about 300 Å. When the thickness of the HBL is within these ranges, the HBL may have improved hole blocking properties without a substantial decrease in driving voltage.

In one embodiment, the ETL 160 including multiple layers is disposed on the EML 150 (or on the HBL that is disposed on the EMI 150).

The ETL 160 includes a unit of a stack of the following layers: a first single layer 161 containing a first material; a first mixed layer 163 disposed on the first single layer 161 and containing the first material and a second material; a second single layer 165 disposed on the first mixed layer 163 and containing the second material; a second mixed layer 167 disposed on the second single layer 165 and containing the first and second materials; and a third single layer 169 disposed on the second mixed layer 167 and containing the first material. The ETL 160 may include two units (two stack units) each including the first single layer 161, the first mixed layer 163, the second single layer 165, the second mixed layer 167, and the third single layer 169.

In one embodiment, due to having the structure in which the first single layer 161, the first mixed layer 163, the second single layer 165, the second mixed layer 167, and the third single layer 169 are sequentially stacked, the ETL 160 effectively controls injection and transport of electrons and blocks holes at the same time.

That is, in a comparable organic light-emitting device, once the comparable organic light-emitting device has been operated, the amounts of electrons or holes may change with time, so that the number of exitons generated in an emission region may be gradually reduced, and carrier balance may be broken. This may be a cause of a reduced lifetime (lifespan) of the organic light-emitting device. However, in the organic light-emitting device 100 with the multi-layered ETL 160 according to an embodiment of the present invention, in which the first and third single layers 161 and 169 have the same energy level, and the first and second mixed layers 163 and 167 have the same energy level, and the first single layer 161 and the first mixed layer 163, and the third single layer 169 and the second mixed layer 167 are symmetric with respect to the second single layer 165, flow rate of electrons is controlled and flow of carriers is maintained constant by thickness adjustment of the first mixed layer 163 and the second mixed layer 167. In particular, the use of an asymmetric structure with the first mixed layer 163 of which thickness is larger than that of the second mixed layer 167 ensures efficient control of the flow rate of electrons and flow of carriers. This may be conducive to improving the lifespan of the organic light-emitting device.

Since the first mixed layer 163 is closer to the emission layer 150 than the second mixed layer 167 is, formation of the first mixed layer 163 to be thicker than the second mixed layer 167 is considered to effectively block migration of holes in the EML 150 into the ETL 160.

In some embodiments, a thickness ratio of the first mixed layer 163 to the second mixed layer 167 may be from about 2:1 to about 5:1.

The first single layer 161 may have a thickness that is larger than that of the third single layer 169.

Near to the second electrode 190, the third single layer 169 is less vulnerable to damage by holes. However, the first single layer 161 adjacent to the EML 150 is more likely to be damaged by holes. Thus, increasing the thickness of the first single layer 161 by as much as a reduction in thickness of the third single layer 169 is envisioned to reduce damage of the first single layer 161 by holes.

In some embodiments a thickness ratio of the first single layer 161 to the third single layer 169 may be from about 1:1 to about 5:1.

Any one of the single layers (i.e., the first single layer 161, the second single layer 165, and the third single layer 169) may have a smaller thickness than that of any one of the mixed layers (i.e., the first mixed layer 163 and the second mixed layer 167). These mixed layers including the second material may be formed to have a uniform concentration or a concentration gradient, because such a uniform concentration or concentration gradient may be more effectively controllable in thicker layers.

In the multi-layered ETL 160, the first single layer 161 and the first mixed layer 163 are asymmetrically thicker than the third single layer 169 and the second mixed layer 167, respectively. That is, the closer the layers are to the EML 150, the thicker the layers are, and the further away the layers are from the EML 150, the thinner the layers are. The multi-layered ETL 160 may control the flow rate of electrons and maintain flow of carriers to be constant, thus improving the lifespan of, in particular, the blue emission layer.

Figure 2:
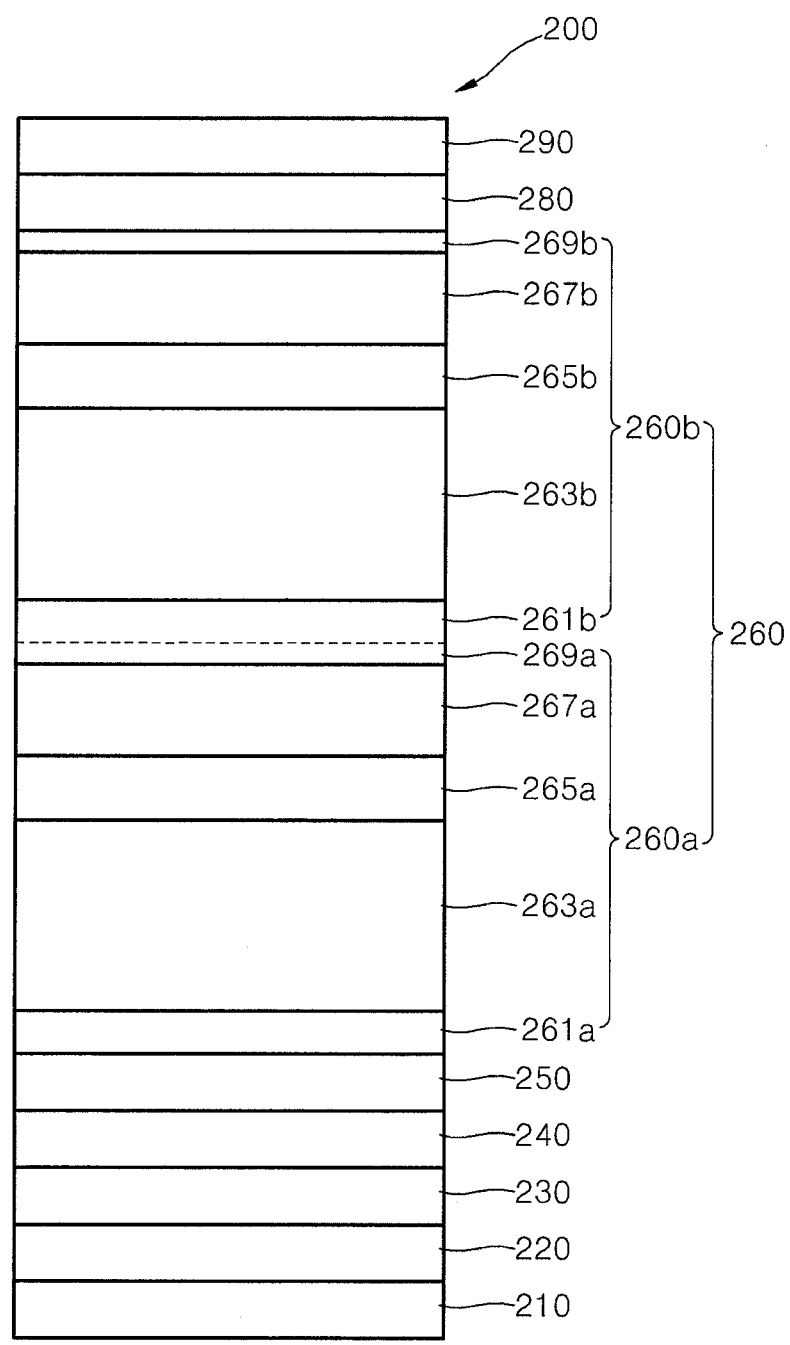
FIG. 2 is a schematic diagram of the structure of an organic light-emitting device according to another embodiment of the present invention.

FIG. 2 is a schematic diagram of the structure of an organic light-emitting device according to another embodiment of the present invention.

Referring to FIG. 2, the organic light emitting device 200 has a structure including a substrate 210, a first electrode 220, a HIL 230, a HTL 240, an EML 250, an ETL 260, an EIL 280, and a second electrode 290 that are sequentially stacked on one another.

The EML 250 may include a blue emission layer. When the organic light-emitting device 200 includes a blue emission layer, the multi-layered ETL 26 may provide advantageous effects as described above.

The ETL 260 includes: a first single layer 261a containing a first material; a first mixed layer 263a disposed on the first single layer 261a and containing the first material and a second material; a second single layer 265a disposed on the first mixed layer 263a and containing the second material; a second mixed layer 267a disposed on the second single layer 265a and containing the first and second materials; a third single layer 269a disposed on the second mixed layer 267a and containing the first material; a fourth single layer 261b disposed on the third single layer 269a and containing the first material; a third mixed layer 263b disposed on the fourth single layer 261b and containing the first and second materials; a fifth single layer 265b disposed on the third mixed layer 263b and containing the second material; a fourth mixed layer 267b disposed on the fifth single layer 265b and containing the first and second materials; and a sixth single layer 269b disposed on the fourth mixed layer 267b and containing the first material. The first mixed layer 263a may have a larger thickness than that of the second mixed layer 267a. The third mixed layer 263b may have a larger thickness than that of the fourth mixed layer 267b.

The first single layer 261a may have a larger thickness than that of the third single layer 269a. The fourth single layer 261b may have a larger thickness than that of the sixth single layer 269b.

In comparing the structures of FIGS. 1 and 2, the ETL 160 of the organic light-emitting device 100 of FIG. 1 includes one unit of the multi-layer structure, while the ETL 260 of the organic light-emitting device of FIG. 2 includes two units 260a and 260b of the multi-layer structure.

The first material may serve to transport electrons. In this regard, the first material may include an anthracene-based material.

In some embodiments, the first material may include at least one of Compound 5 represented by the following formula, a compound represented by Formula 1 below, and a compound represented by Formula 2.

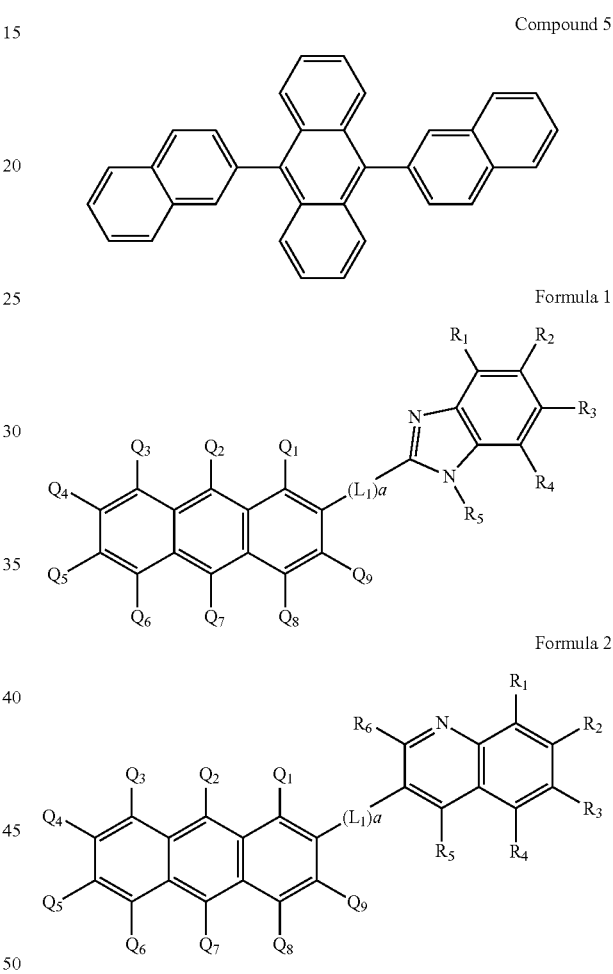

Compound 5

Formula 1

Formula 2

In Formulae 1 and 2 above, $R_1$ to $R_6$ are each independently a hydrogen atom, a halogen atom, a hydroxy group, a cyano group, a substituted or unsubstituted $C_1$-$C_{30}$ alkyl group, a substituted or unsubstituted $C_1$-$C_{30}$ alkoxy group, a substituted or unsubstituted $C_1$-$C_{30}$ acyl group, a substituted or unsubstituted $C_2$-$C_{30}$ alkenyl group, a substituted or unsubstituted $C_2$-$C_{30}$ alkynyl group, a substituted or unsubstituted $C_5$-$C_{30}$ aryl group, or a substituted or unsubstituted $C3$-$C_{30}$ heteroaryl group, wherein at least two adjacent groups of $R_1$ to $R_6$ are selectively bonded to each other to form a saturated or unsaturated ring; $L_1$ is a single bond, a substituted or unsubstituted $C_1$-$C_{30}$ alkylene group, a substituted or unsubstituted $C_5$-$C_{30}$ arylene group, or a substituted or unsubstituted $C_2$-$C_{30}$ heteroarylene group; $Q_1$ to $Q_9$ are each independently a hydrogen atom, a substituted or unsubstituted $C_5$-$C_{30}$ aryl group, or a substituted or unsubstituted $C_3$-$C_{30}$ heteroaryl group; and a is an integer from 1 to 10.

In some embodiments, $R_1$ to $R_6$ may be each independently a hydrogen atom, a halogen atom, a hydroxyl group, a cyano group, a methyl group, an ethyl group, a propyl group, a butyl group, a methoxy group, an ethoxy group, a propoxy group, a butoxy group, a phenyl group, a naphthyl group, an anthryl group, a pyridinyl group, or a pyrazinyl group, but are not limited thereto. For example, in Formula 1 above, $R_1$ to $R_4$ may be each independently a hydrogen atom, a methyl group, an ethyl group, a propyl group, a butyl group, a methoxy group, an ethoxy group, a propoxy group, a butoxy group, a phenyl group, a naphthyl group, or an anthryl group. For example, in Formula 2 above, $R_1$ to $R_4$ may be all hydrogen atoms, but are not limited thereto.

For example, $Q_1$ to $Q_9$ may be each independently a hydrogen atom, a phenyl group, a naphthyl group, an anthryl group, a pyridinyl group, or a pyrazinyl group, but are not limited thereto. In some other embodiments, in Formulae 1 and 2, $Q_1$, $Q_3$ to $Q_6$, $Q_8$, and $Q_9$ may be all hydrogen atoms, and $Q_2$ and $Q_7$ may be each independently a phenyl group, a naphthyl group, an anthryl group, a pyridinyl group, or a pyrazinyl group, but are not limited thereto.

For example, $L_1$ may be a phenylene group, a naphthylene group, an anthrylene group, a pyridinylene group, or a pyrazinylene group, but are not limited thereto. For example, $L_1$ may be a phenylene group or a pyridinylene group.

For example, a may be an integer of 1, 2 or 3, but is not limited thereto.

The first material may be Compound 5, 6 or 7 below:

Compound 5

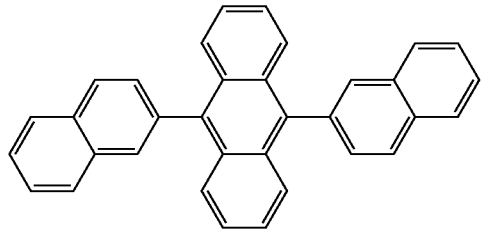

Compound 6

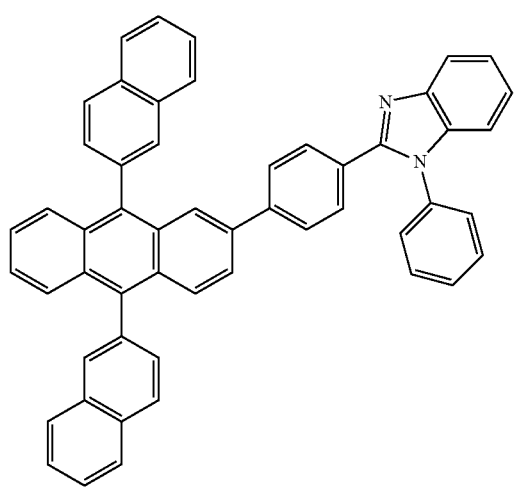

Compound 7

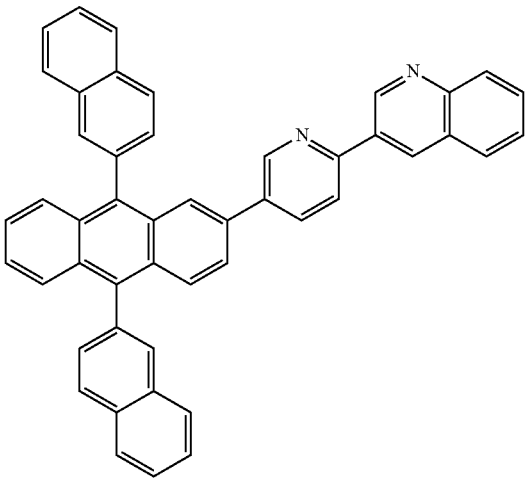

The second material may serve to inject electrons and block holes. In this regard, the second material may be a lithium (Li) complex.

For example, the second material may include at least one of lithium quinolate (LiQ) and Compound 8 (LtBTZ) below, but is not limited thereto.

Compound 8

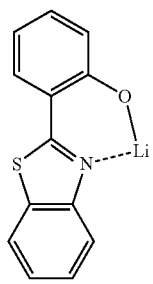

The first single layer 161, the second single layer 165, and the third single layer 169 may each independently have a thickness of from about 1 Å to about 100 Å, and in some embodiments, may have a thickness of from about 5 Å to about 100 Å, and in some other embodiments, may have a thickness of from 5 Å to about 60 Å. In one embodiment, when the thicknesses of the first single layer 161, the second single layer 165 and the third single layer 169 are within these ranges, these layers effectively inject and transport electrons without a substantial increase in driving voltage.

The first mixed layer 163 and the second mixed layer 167 may each independently have a thickness of from about 10 Å to about 300 Å, and in some embodiments, may have a thickness of from about 60 Å to about 160 Å, and in some other embodiments, may have a thickness of from 60 Å to about 100 Å. In one embodiment, when the thicknesses of the first mixed layer 163 and the second mixed layer 167 are within these ranges, these layers effectively inject and transport electrons without a substantial increase in driving voltage.

An amount of the second material in the first mixed layer 163 may be from about 30 parts to about 70 parts by weight, and in some embodiments, may be from about 45 parts to about 55 parts by weight, based on 100 parts by weight of the first mixed layer 163. An amount of the second material in the second mixed layer 167 may be from about 30 parts to about 70 parts by weight, and in some embodiments, may be from about 45 parts to about 55 parts by weight, based on 100 parts by weight of the second mixed layer 167. In one embodiment, when the amounts of the second material in the first mixed layer 163 and the second mixed layer 167 are within these ranges, high emission efficiency is obtained.

A weight ratio of the first material to the second material in the first mixed layer 163 and/or the second mixed layer 167 may be each independently from about 100:1 to about 100: 100. In one embodiment, when the weight ratio of the first material to the second material is within this range, high emission efficiency and improved lifetime characteristics are obtained.

The first material and second material may be homogeneously mixed in the first mixed layer 163. A weight ratio of the first material to the second material homogeneously mixed together may be within the above-described range.

The second material in at least one of the first mixed layer 163 and the second mixed layer 167 may have a concentration gradient. The concentrations of the first material and second material in the first mixed layer 163 and/or the second mixed layer 167 may continuously or gradually vary.

For example, the concentration of the second material in the first mixed layer 163 may continuously increase or decrease in a direction from the first single layer 161 toward the second single layer 165. In one embodiment, this leads to a reduced driving voltage and improved lifetime of the organic light-emitting device 100.

In some embodiments, when the second material has a concentration gradient, a weight ratio of the first material to the second material in an interface between the first single layer 161 and the first mixed layer 163 may be about 100:1, a weight ratio of the first material to the second material in an interface between the first mixed layer 163 and the second single layer 165 may be about 100:100, and the concentration of the second material in the first mixed layer 163 may gradually increase in a direction from the first signal layer 161 toward the second single layer 165.

As described above in conjunction with the first mixed layer 163, the first material and second material may be homogeneously mixed in the second mixed layer 167, or the second material in the second mixed layer 167 may have a concentration gradient.

For example, the concentration of the second material in the second mixed layer 167 may continuously increase or decrease in a direction from the second single layer 165 toward the third single layer 169. In one embodiment, this leads to a reduced driving voltage and improved lifetime of the organic light-emitting device 100.

In some other embodiments, a weight ratio of the first material to the second material in an interface between the second single layer 165 and the second mixed layer 167 may be about 100:100, a weight ratio of the first material to the second material in an interface between the second mixed layer 167 to the third single layer 169 may be about 100:1, and the concentration of the second material in the second mixed layer 167 may gradually decrease in a direction from the second single layer 165 toward the third single layer 169.

The ETL 160 may be formed on the EML 150 (or on the HBL on the EML 150) by using any of a variety of methods, such as vacuum deposition, spin coating, or casting. When the ETL 160 is formed using vacuum deposition or spin coating, the deposition and coating conditions may be similar to those for the formation of the HIL 130, though the deposition and coating conditions may vary according to a compound that is used to form the ETL 160.

When using the deposition method, the ETL 160 may be formed through the following processes: preparing a first deposition source for discharging the first material and a second deposition source for discharging the second material; locating the first deposition source and the second deposition source with a set or predetermined separation gap to define a first overlapping region in which the first deposition region and the second deposition region overlap each other; and reciprocating the first deposition source and the second deposition source at least one time between first and second (opposing) ends (i.e., beginning from the first end to the second end, and then back to the first end), thereby forming at least one unit that includes a first single layer containing the first material, a first mixed layer disposed on the first single layer and containing the first and second materials, a second single layer disposed on the first mixed layer and containing the second material, a second mixed layer disposed on the second single layer and containing the first and second materials, and a third single layer disposed on the second mixed layer and containing the first material.

Hereinafter, a method of forming the ETL 160 having the multi-layer structure on the EML 150 will be described.

The first deposition source and the second deposition source may be located underneath a surface of the EML 150 (i.e., opposite to the surface on which the HIL 130 and the HTL 140 are formed). The first deposition source may be a deposition source for discharging the first material, and the second deposition source may be a deposition source for discharging the second material. A first discharging region into which the first material is discharged from the first deposition source and a second discharging region into which the second material is discharged from the second deposition source may each be in a fan shape having a set or predetermined angle.

The first deposition source and second deposition source may be located with a set or predetermined separation gap therebetween to define an overlapping region between the first material discharging region and the second material discharging region. Thus, the first material and second material may be simultaneously or concurrently deposited to form a mixed layer containing both the first and second materials.

While a base on which the first deposition source and the second deposition source are loaded with a set or predetermined separation gap as described above are moved above a target surface of the EML 150 in a movement direction from the first end of the EML 150 to the second end, initially only the first material is deposited on the EML 150, thus forming the first single layer 161 that contains the first material. As the base with the first deposition source and the second deposition source thereon continues to be moved in the movement direction, the first material and the second material are simultaneously or concurrently deposited on the first single layer 161 containing the first material, thus forming the first mixed layer 163 containing the first and second materials on the first single layer 161. As the base with the first deposition source and the second deposition source thereon further continues to be moved in the movement direction, only the second material is deposited on the first mixed layer 163, thus forming a second material-containing layer on the first mixed layer 163. Once the base moving in the movement direction to the second end with the first and second deposition sources thereon has reached the second end of the EML 150, the first single layer 161 containing the first material, the first mixed layer 163 containing the first and second materials, and the second material-containing layer result in on the surface of the EML 150. The second material in the first mixed layer 163 may have a concentration gradient, or the first and second materials in the first mixed layer 163 may be homogeneously mixed together. The base that has reached the second end of the EML 150, which is disposed under the moving base, begins to move backwards toward the first end. Then, another second material-containing layer begins to form. While the base further moves in the backward direction, a second mixed layer 167 containing the first and second materials, and a third single layer 169 containing the second material may be sequentially formed on the second single layer 165. Since having the same composition, the two second material-containing layers may have an indistinct interface, and thus may appear as if they are a single layer. While the base with the first deposition source and the second deposition source loaded thereon reciprocates between the first and second ends of the EML 150 once, i.e., moves beginning from the first end of the EML 150 and returns thereto via the second end of the EML 150, based on the above-described principle, the ETL 160 having one unit of those layers described above may be formed. The method involves simplified and rapid deposition processes, which are almost simultaneously performed within the same chamber to form multiple layers, and do not involve discharging between formation of each layer.

As used herein, the term "substituted A" of the "substituted or unsubstituted A (wherein A is a substituent)" refers to a group A of which at least one hydrogen atom is substituted with one of a deuterium atom, a halogen atom, a hydroxyl group, a cyano group, a nitro group, a carboxyl group, a silyl group or a salt derivative thereof, a sulfonic acid group or a salt derivative thereof, a phosphoric acid group or a salt derivative thereof, a $C_1$-$C_{50}$ alkyl group, a $C_2$-$C_{50}$ alkenyl group, a $C_2$-$C_{50}$ alkynyl group, a $C_1$-$C_{50}$ alkoxy group, a $C_3$-$C_{50}$ cycloalkyl group, a $C_3$-$C_{50}$ cycloalkenyl group, a $C_5$-$C_{60}$ aryl group, a $C_5$-$C_{60}$ aryloxy group, a $C_5$-$C_{60}$ arylthio group, a $C_2$-$C_{60}$ heteroaryl group, a $C_2$-$C_{60}$ condensed polycyclic group, a group represented by $N(Q_{101})(Q_{102})$, and a group represented by $Si(Q_{103})(Q_{104})(Q_{105})$, wherein $Q_{101}$ to $Q_{105}$ may be each independently one of a hydrogen atom, a deuterium atom, a halogen atom, a hydroxyl group, a cyano group, an amino group, a nitro group, a carboxyl group, a silyl group, a $C_1$-$C_{50}$ alkyl group, a $C_2$-$C_{50}$ alkenyl group, a $C_2$-$C_{50}$ alkynyl group, a $C_1$-$C_{50}$ alkoxy group, a $C_3$-$C_{50}$ cycloalkyl group, a $C_3$-$C_{50}$ cycloalkenyl group, a $C_5$-$C_{60}$ aryl group, a $C_5$-$C_{60}$ aryloxy group, a $C_5$-$C_{60}$ arylthio group, a $C_2$-$C_{60}$ heteroaryl group, and a $C_2$-$C_{60}$ condensed polycyclic group.

For example, the term "substituted A" may refer to a group A of which at least one hydrogen atom is substituted with one of a deuterium atom, a halogen atom, a hydroxyl group, a cyano group, a nitro group, a carboxyl group, a silyl group, a methyl group, an ethyl group, a propyl group, a butyl group, a pentyl group, a phenyl group, a biphenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, an anthryl group, a fluoranthenyl group, a triphenyllenyl group, a pyrenyl group, a chrycenyl group, a naphthacenyl group, a picenyl group, a perylenyl group, a pentaphenyl group, a hexacenyl group, a pyrrolyl group, an imidazolyl group, a benzoimidazolyl group, a phenylbenzoimidazolyl group, a pyrazolyl group, a pyridinyl group, a phenylpyridinyl group, a phenylimidazopyridinyl group, a pyrazinyl group, a pyrimidinyl group, a phenylimidazopyrimidinyl group, an imidazopyrimidinyl group, a pyridazinyl group, an indolyl group, an isoindolyl group, an indazolyl group, a furinyl group, a quinolinyl group, a benzoquinolinyl group, a phthalazinyl group, a phthalazinyl group, a quinoxalinyl group, a quinazolinyl group, a cinolinyl group, a carbazolyl group, a phenanthridinyl group, an acridinyl group, a phenanthrolinyl group, a phenazinyl group, a furanyl group, a benzofuranyl group, a dibenzofuranyl group, a thiophenyl group, a benzo[b]thiophenyl group, a dibenzothiophenyl group, a thiazolyl group, an isothiazolyl group, a benzothiazolyl group, an oxazolyl group, an isoxazolyl group, a benzooxazolyl group, a triazolyl group, a phenyltriazolyl group, a tetrazolyl group, an oxadiazolyl group, a phenyloxadiazolyl group, a triazinyl group, a phenyltriazinyl group, a diphenylethynyl group, a phenylethynylfluorenyl group, a phenylethynylnaphthyl group, a group represented by $N(Q_{101})(Q_{102})$, and a group represented by $Si(Q_{103})(Q_{104})(Q_{105})$.

In an embodiment of the present invention, the organic light-emitting device described above may be included in a flat panel display device. According to an embodiment of the present invention, a flat panel display device includes: a transistor that includes a source, a drain, a gate, and an active layer; and the organic light-emitting device including the ETL 160 having the multi-layer structure, wherein one of the source and the drain is electrically connected to the first electrode of the organic light-emitting device.

The active layer of the transistor may be any of an amorphous silicon layer, a crystalline silicon layer, an organic semiconductor layer, and an oxide semiconductor layer, but is not limited thereto.

One or more embodiments of the organic light-emitting device according to the present invention will now be described in more detail with reference to the following examples. However, these examples are for illustrative purposes only and are not intended to limit the scope of the one or more embodiments.

EXAMPLE 1

A 15 Ω/cm² (1,200 Å) ITO glass substrate (available from Corning Co.) with an ITO electrode was cut to a size of 50 mm×50 mm×0.7 mm, ultrasonically washed with isopropyl alcohol for 5 minutes and then with pure water for 5 minutes, and washed again with UV ozone for 30 minutes. Then, m-MTDATA was vacuum deposited on the ITO electrode of the substrate to form a HIL having a thickness of about 750 Å, and then α-NPD was vacuum-deposited on the HIL to form a HTL having a thickness of about 150 Å.

A 300 Å-thick red emission layer including 92 wt % of $Zn(BTZ)_2$ as a host and 8 wt % of $Ir(piq)_3$ as a dopant, a 300 Å-thick green emission layer including 97 wt % of Compound 1 as a host and 3 wt % of Compound 3 as a dopant, and a 300 Å-thick blue emission layer including 95 wt % of Compound 2 as a host and 5 wt % of Compound 4 as a dopant were formed on the HTL via patterning.

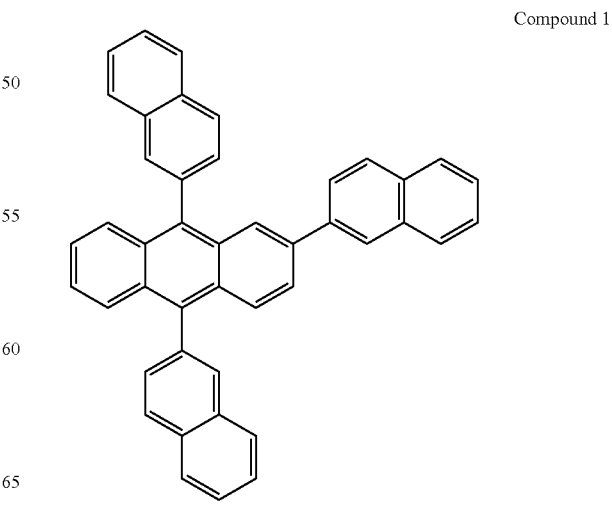

Compound 1

-continued

Compound 3

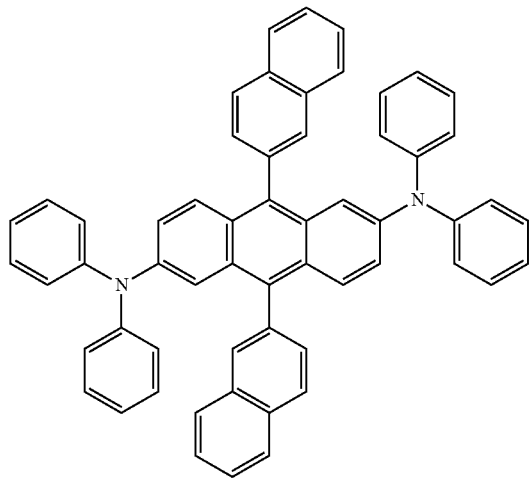

Compound 4

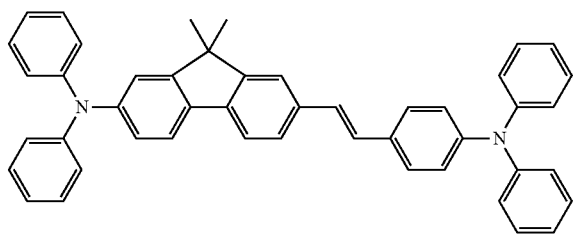

Afterward, an ETL having the following multi-layer structure was formed by reciprocating deposition sources using Compound 7 as the first material and LiQ as the second material twice:

7.5 Å-thick first single layer containing Compound 7;

123 Å-thick first mixed layer containing Compound 7 and LiQ;

10 Å-thick second single layer containing LiQ;

41 Å-thick second mixed layer containing Compound 7 and LiQ;

2.5 Å-thick third single layer containing Compound 7, and 7.5 Å-thick fourth single layer containing Compound 7 (Due to an indistinct interface between the third and fourth single layers, the third and fourth single layers may appear as if they are as a 10 Å-thick single layer containing Compound 7);

123 Å-thick third mixed layer containing Compound 7 and LiQ;

10 Å-thick fifth single layer containing LiQ;

41 Å-thick fourth mixed layer containing Compound 7 and LiQ; and 2.5 Å-thick sixth single layer containing Compound 7.

LiF was vacuum-deposited on the ETL to form an EIL having a thickness of 80 Å, followed by vacuum deposition of Al on the EIL to form a cathode having a thickness of 1000 Å.

COMPARATIVE EXAMPLE 1

A HIL, a HTL, and an EML were formed on an ITO electrode of a glass substrate in the same manner as in Example 1.

Afterward, an ETL having the following multi-layer structure was formed on the EML (i.e., the red, green and blue emission layers) by reciprocating deposition sources using Compound 7 as the first material and LiQ as the second material twice:

5 Å-thick first single layer containing Compound 7;

82 Å-thick first mixed layer containing Compound 7 and LiQ;

10 Å-thick second single layer containing LiQ;

82 Å-thick second mixed layer containing Compound 7 and LiQ;

5 Å-thick third single layer containing Compound 7, and 5 Å-thick fourth single layer containing Compound 7 (Due to an indistinct interface between the third and fourth single layers, the third and fourth single layers may appear as if they are as a 10 Å-thick single layer containing Compound 7);

82 Å-thick third mixed layer containing Compound 7 and LiQ;

10 Å-thick fifth single layer containing LiQ;

82 Å-thick fourth mixed layer containing Compound 7 and LiQ; and

5 Å-thick sixth single layer containing Compound 7.

LiF was vacuum-deposited on the ETL to form an EIL having a thickness of 80 Å, followed by vacuum deposition of Al on the EIL to form a cathode having a thickness of 1000 Å.

EVALUATION EXAMPLE 1

Figure 3:
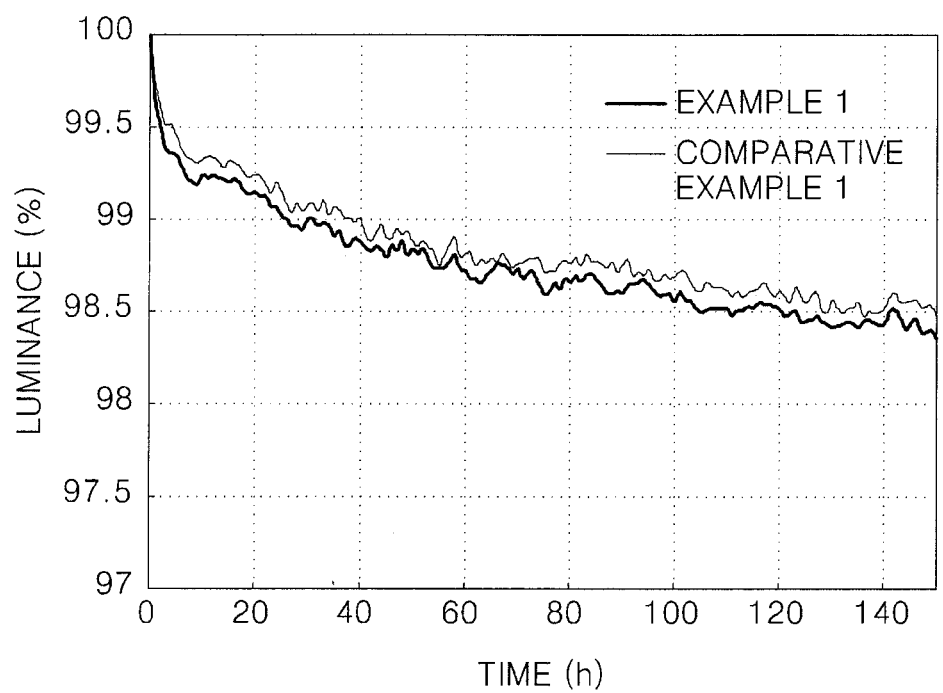
FIG. 3 is a graph of luminance with respect to time in red emission layers of organic light-emitting devices manufactured in Example 1 and Comparative Example 1.
Figure 4:
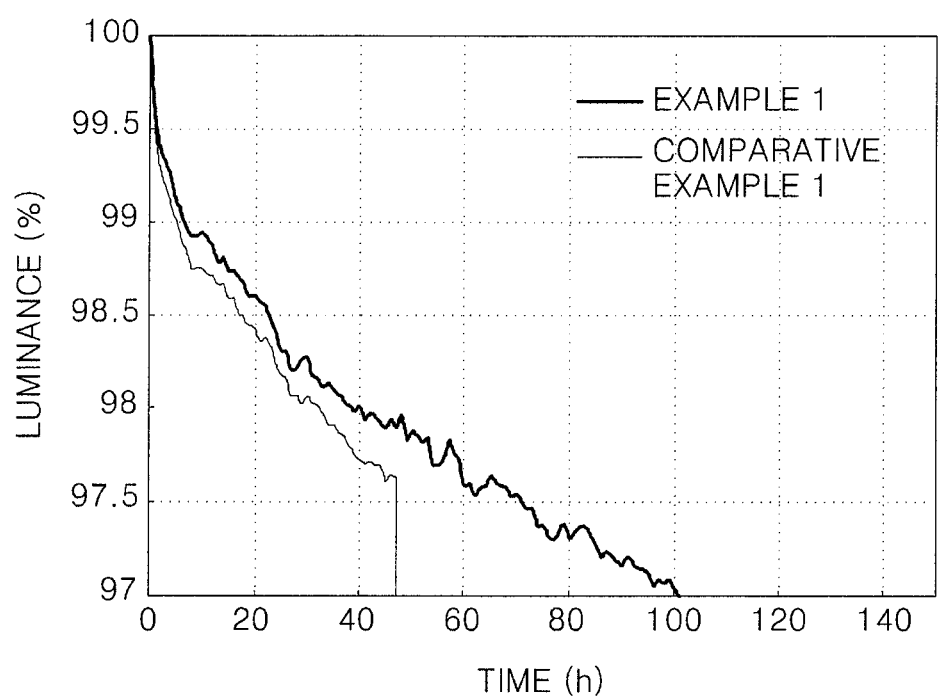
FIG. 4 is a graph of luminance with respect to time in green emission layers of the organic light-emitting devices manufactured in Example 1 and Comparative Example 1.
Figure 5:
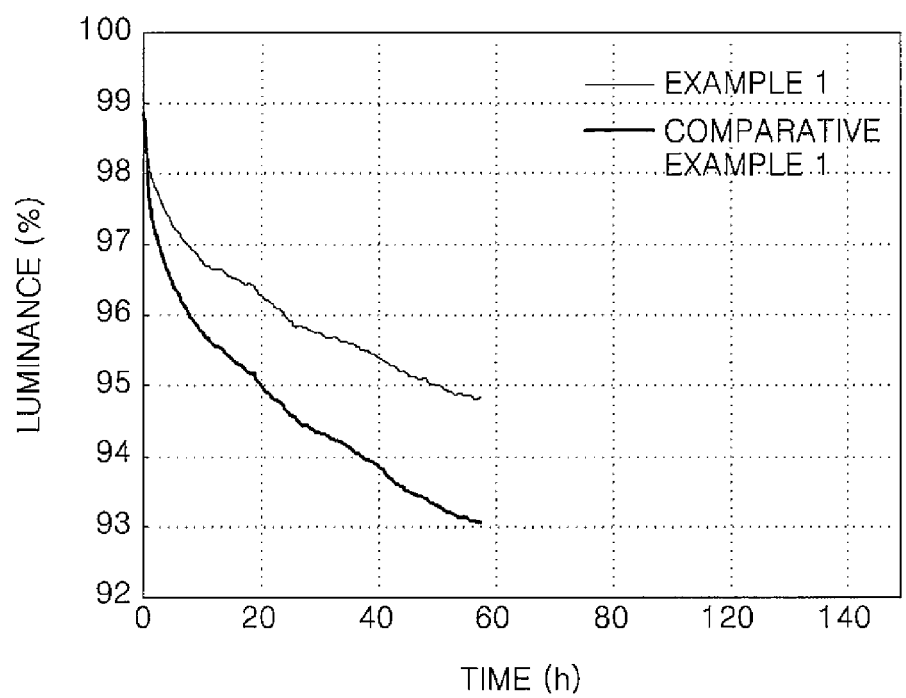
FIG. 5 is a graph of luminance with respect to time in blue emission layers of the organic light-emitting devices manufactured in Example 1 and Comparative Example 1.

Luminances of red, green, and blue emission layers in the organic light-emitting devices of Example 1 and Comparative Example 1 were measured with respect to time (t). The results are shown in FIGS. 3, 4, and 5, respectively. The Y-axis in FIGS. 3, 4, and 5 represents luminance ratio with respect to luminance (100%) at t=0. The luminances were measured using a PR650 (Spectroscan) Source Measurement Unit (available from Photo Research, Inc.).

Referring to FIG. 3, the lifetime of the organic light-emitting device of Example 1 as measured with respect to the red emission layer is found to be substantially the same as that of the organic light-emitting device of Comparative Example 1. Referring to FIG. 4, the lifetime of the organic light-emitting device of Example 1 as measured with respect to the green emission layer is found to be the same or longer than that of the organic light-emitting device of Comparative Example 1. Referring to FIG. 5, the lifetime of the organic light-emitting device of Example 1 as measured with respect to the blue emission layer is found to be about 250% longer than that of the organic light-emitting device of Comparative Example 14 at a 95% drop point.

EVALUATION EXAMPLE 2

External luminescent efficiencies and driving voltages of the organic light-emitting devices of Example 1 and Comparative Example 1 were measured using a PR650 (Spectroscan) Source Measurement Unit (available from PhotoResearch, Inc.). The results are shown in Table 1.

TABLE 1

| | Red EML | | | Green EML | | | Blue EML | | |
|---|---|---|---|---|---|---|---|---|---|
| | Driving voltage (V) | Efficiency (cd/A) | CIE_x | Driving voltage (V) | Efficiency (cd/A) | CIE_x | Driving voltage (V) | B_efficiency/y) | CIE_y |
| Example 1 | 4.9 | 34.5 | .667 | 4.8 | 74.3 | .232 | 4.1 | 71.3 | .045 |
| Comparative Example 1 | 5.3 | 33.9 | .668 | 4.9 | 75.0 | .235 | 4.1 | 74.9 | .044 |

Referring to Table 1, the organic light-emitting device of Example 1 has a driving voltage lower by 0.4V and a similar efficiency as compared with the organic light-emitting device of Comparative Example 1, when measured using the red EML. The driving voltage and efficiency of the organic light-emitting device of Example 1 measured using the green EML were found to be almost the same as those of the organic light-emitting device of Comparative Example 1. The driving voltage and efficiency of the organic light-emitting device of Example 1 measured using the blue EML were found to be almost the same as those of the organic light-emitting device of Comparative Example 1.

As is apparent from the above, compared with the organic light-emitting device of Comparative Example 1, the organic light-emitting device of Example 1 is about 250% longer in lifetime and substantially similar in driving voltage and efficiency, only as measured with respect to the blue EML.

As described above, according to the one or more of the above embodiments of the present invention, using a material and structure of an ETL different from those used in a comparable organic light-emitting device, an organic light-emitting device may have a markedly improved lifetime (lifespan) of a blue light-emitting device as compared with the comparable organic light-emitting device while characteristics (including lifetimes) of green and red light-emitting devices remain substantially or about the same as the comparable organic light-emitting device.

While the present invention has been particularly shown and described with reference to exemplary embodiments thereof, it will be understood by those of ordinary skill in the art that various changes in form and details may be made therein without departing from the spirit and scope of the present invention as defined by the following claims, and equivalents thereof.

What is claimed is:

1. An organic light-emitting device comprising:
a substrate; a first electrode; a second electrode; an emission layer between the first electrode and the second electrode; and an electron transport layer between the emission layer and the second electrode,
wherein:
the emission layer comprises a blue emission layer,
the electron transport layer comprises a unit comprising a first single layer including a first material, a first mixed layer on the first single layer and including the first material and a second material, a second single layer on the first mixed layer and including the second material, a second mixed layer on the second single layer and including the first and second materials, and a third single layer on the second mixed layer and including the first material,
wherein the first mixed layer has a thickness larger than that of the second mixed layer, and
wherein the first material comprises at least one selected from the group consisting of a 9,10-diaryl-anthracene-based material, a compound represented by Formula 1 below, and a compound represented by Formula 2 below:

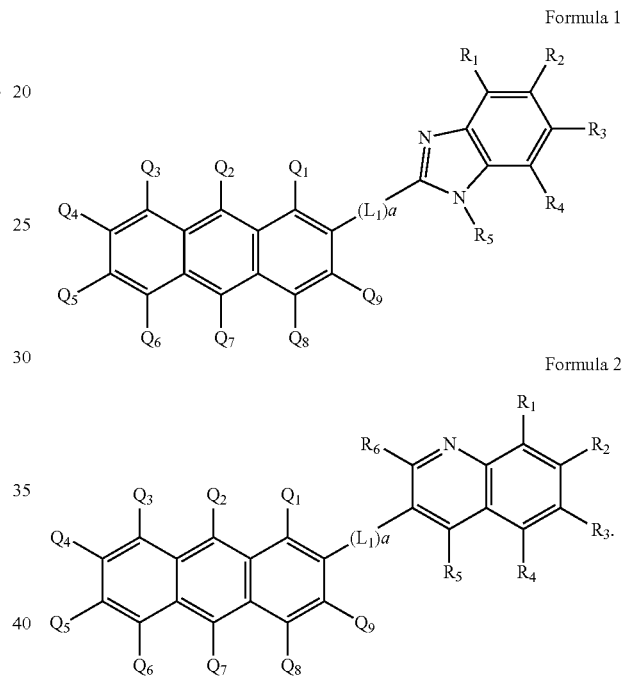

wherein, in Formulae 1 and 2, $R_1$ to $R_6$ are each independently a hydrogen atom, a halogen atom, a hydroxy group, a cyano group, a substituted or unsubstituted $C_1$-$C_{30}$ alkyl group, a substituted or unsubstituted $C_1$-$C_{30}$ alkoxy group, a substituted or unsubstituted $C_1$-$C_{30}$ acyl group, a substituted or unsubstituted $C_2$-$C_{30}$ alkenyl group, a substituted or unsubstituted $C_2$-$C_{30}$ alkynyl group, a substituted or unsubstituted $C_5$-$C_{30}$ aryl group, or a substituted or unsubstituted $C_2$-$C_{30}$ heteroaryl group, wherein at least two adjacent groups of $R_1$ to $R_6$ are selectively bonded to each other to form a saturated or unsaturated ring;
$L_1$ is a single bond, a substituted or unsubstituted $C_1$-$C_{30}$ alkylene group, a substituted or unsubstituted $C_5$-$C_{30}$ arylene group, or a substituted or unsubstituted $C_2$-$C_{30}$ hetero arylene group;
$Q_1$ to $Q_9$ are each independently a hydrogen atom, a substituted or unsubstituted $C_5C_{30}$ aryl group, or a substituted or unsubstituted $C_3$-$C_{30}$ heteroaryl group; and
a is an integer from 1 to 10.

2. The organic light-emitting device of claim 1, wherein the electron transport layer comprises a plurality of units comprising the unit, each of the plurality of units being identical with one another.

3. The organic light-emitting device of claim 1, wherein a thickness ratio of the first mixed layer to the second mixed layer is from about 2:1 to about 5:1.

4. The organic light-emitting device of claim 1, wherein the first mixed layer has a thickness that is larger than that of the third mixed layer.

5. The organic light-emitting device of claim 1, wherein a thickness ratio of the first single layer to the third single layer is from about 2:1 to about 5:1.

6. The organic light-emitting device of claim 1, wherein the first single layer, the second single layer, and the third single layer each independently have a thickness of from about 1 Å to about 100 Å.

7. The organic light-emitting device of claim 1, wherein the first mixed layer and the second mixed layer each independently have a thickness of from about 10 Å to about 300 Å.

8. The organic light-emitting device of claim 1, wherein one of the first single layer, the second single layer, and the third single layer has a thickness smaller than that of one of the first mixed layer and the second mixed layer.

9. The organic light-emitting device of claim 1, wherein the second material in at least one of the first mixed layer and the second mixed layer has a concentration gradient.

10. The organic light-emitting device of claim 1, wherein the first material comprises at least one of a compound 5, a compound 6 and a compound 7 represented by the following formulae:

Compound 5

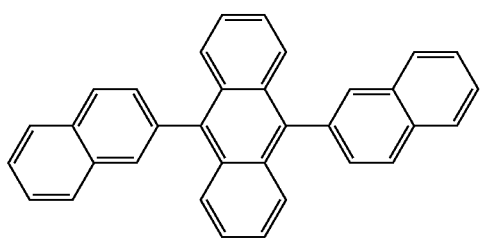

Compound 6

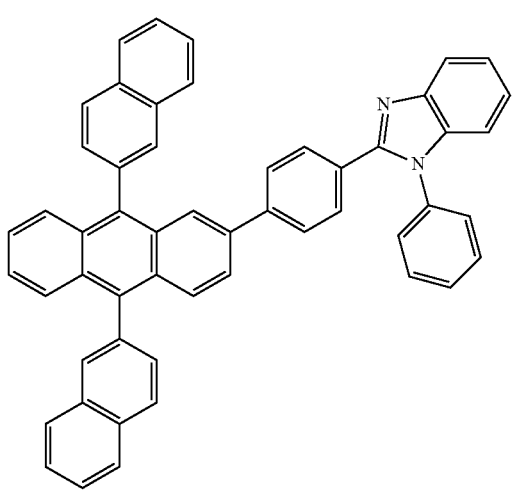

Compound 7

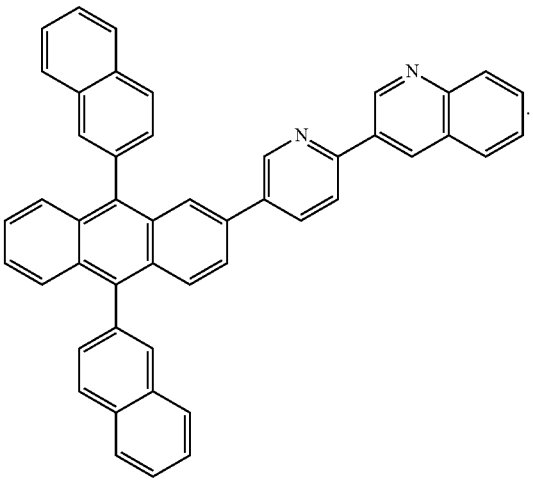

11. The organic light-emitting device of claim 1, wherein the second material comprises a lithium (Li) complex.

12. The organic light-emitting device of claim 1, wherein the second material comprises at least one of lithium quinolate and a compound 8 represented by the following formula:

Compound 8

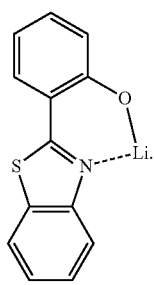

13. The organic light-emitting device of claim 1, further comprising at least one of a hole injection layer and a hole transport layer between the first electrode and the emission layer.

14. The organic light-emitting device of claim 1, further comprising an electron injection layer between the electron transport layer and the second electrode.

15. The organic light-emitting device of claim 1, wherein the electron transport layer further comprises: a fourth single layer on the third single layer and including the first material; a third mixed layer on the fourth single layer and including the first and second materials; a fifth single layer on the third mixed layer material and including the second material; a fourth mixed layer on the fifth single layer and including the first and second materials; and a sixth single layer on the fourth mixed layer and including the first material,
wherein the third mixed layer has a thickness larger than that of the fourth mixed layer, and the fourth single layer has a thickness larger than that of the sixth single layer.

16. A method of manufacturing an organic light-emitting device, the method comprising:
forming a first electrode on a substrate; forming an emission layer on the first electrode; forming an electron transport layer on the emission layer; and forming a second electrode on the electron transport layer, wherein the forming of the electron transport layer comprises:
preparing a first deposition source for discharging a first material, and a second deposition source for discharging a second material;
disposing the first deposition source and the second deposition source to be so separated from each other that a first material discharging region and a second material discharging region at least partially overlap with each other; and
reciprocating the first deposition source and the second deposition source at least once between first and second ends of a region for forming the electron transport layer to form a unit comprising a first single layer including a first material, a first mixed layer on the first single layer and including the first material and a second material, a second single layer on the first mixed layer and including the second material, a second mixed layer on the second single layer and including the first and second materials, and a third single layer on the second mixed layer and including the first material,
wherein the first mixed layer has a thickness larger than that of the second mixed layer, and
wherein the first material comprises at least one selected from the group consisting of a 9,10-diaryl-anthracene-based material, a compound represented by Formula 1 below, and a compound represented by Formula 2 below:

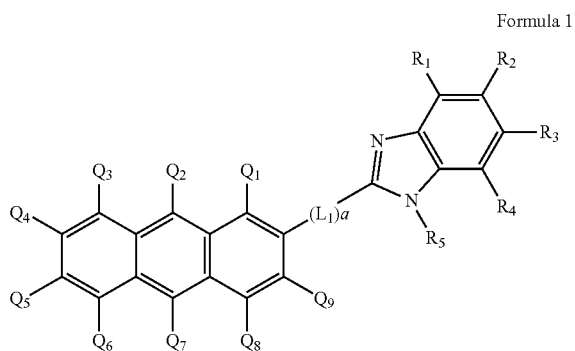

Formula 1

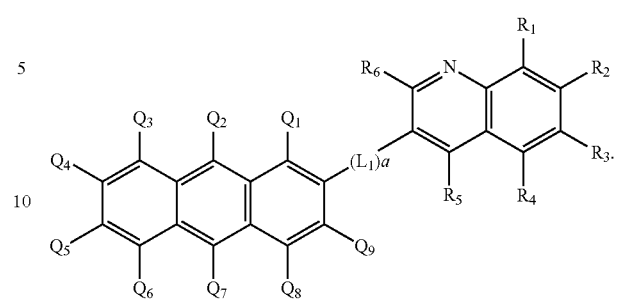

Formula 2 wherein, in Formulae 1 and 2, $R_1$ to $R_6$ are each independently a hydrogen atom, a halogen atom, a hydroxy group, a cyano group, a substituted or unsubstituted $C_1$-$C_{30}$ alkyl group, a substituted or unsubstituted $C_1$-$C_{30}$ alkoxy group, a substituted or unsubstituted $C_1$-$C_{30}$ acyl group, a substituted or unsubstituted $C_2$-$C_{30}$ alkenyl group, a substituted or unsubstituted $C_2$-$C_{30}$ alkynyl group, a substituted or unsubstituted $C_5$-$C_{30}$ aryl group, or a substituted or unsubstituted $C_2$-$C_{30}$ heteroaryl group, wherein at least two adjacent groups of $R_1$ to $R_6$ are selectively bonded to each other to form a saturated or unsaturated ring;
$L_1$ is a single bond, a substituted or unsubstituted $C_1$-$C_{30}$ alkylene group, a substituted or unsubstituted $C_5$-$C_{30}$ arylene group, or a substituted or unsubstituted $C_2$-$C_{30}$ hetero arylene group;
$Q_1$ to $Q_9$ are each independently a hydrogen atom, a substituted or unsubstituted $C_5$-$C_{30}$ aryl group, or a substituted or unsubstituted $C_3$-$C_{30}$ heteroaryl group; and
a is an integer from 1 to 10.

17. The method of claim 16, wherein the reciprocating of the first deposition source and the second deposition source is performed twice.

18. A flat panel display device comprising: a transistor comprising a source, a drain, a gate, and an active layer; and the organic light-emitting device according to claim 1, wherein one of the source and drain of the transistor is electrically connected to the first electrode of the organic light-emitting device.

* * * * *